(12) United States Patent
Ratajczak et al.

(10) Patent No.: US 11,845,876 B2
(45) Date of Patent: Dec. 19, 2023

(54) SEMI-OXIDATIVE SOL-GEL PRINTING METHOD AND CORRESPONDING INK FORMULATIONS

(71) Applicant: INURU GMBH, Berlin (DE)

(72) Inventors: Marcin Ratajczak, Berlin (DE); Maciej Woloszka, Berlin (DE); Patrick Barkowski, Berlin (DE)

(73) Assignee: Inuru GmbH, Berlin (DE)

( * ) Notice: Subject to any disclaimer, the term of this patent is extended or adjusted under 35 U.S.C. 154(b) by 825 days.

(21) Appl. No.: 16/980,492

(22) PCT Filed: Jan. 16, 2019

(86) PCT No.: PCT/EP2019/051015
§ 371 (c)(1),
(2) Date: Sep. 14, 2020

(87) PCT Pub. No.: WO2019/141712
PCT Pub. Date: Jul. 25, 2019

(65) Prior Publication Data
US 2021/0371689 A1    Dec. 2, 2021

(30) Foreign Application Priority Data

Jan. 16, 2018  (DE) .................. 102018100836.8

(51) Int. Cl.
| | | |
|---|---|---|
| *C09D 11/52* | (2014.01) |
| *C09D 11/36* | (2014.01) |
| *C09D 11/38* | (2014.01) |
| *H10K 71/13* | (2023.01) |
| *H10K 50/15* | (2023.01) |
| *H10K 50/18* | (2023.01) |
| *H10K 71/40* | (2023.01) |

(52) U.S. Cl.
CPC .............. *C09D 11/52* (2013.01); *C09D 11/36* (2013.01); *C09D 11/38* (2013.01); *H10K 50/15* (2023.02); *H10K 50/18* (2023.02); *H10K 71/13* (2023.02); *H10K 71/40* (2023.02)

(58) Field of Classification Search
CPC ......... C09D 11/36; C09D 11/38; C09D 11/52; H10K 71/13
See application file for complete search history.

(56) References Cited

U.S. PATENT DOCUMENTS

2019/0023930 A1*  1/2019  Swisher ................. H10K 71/15

FOREIGN PATENT DOCUMENTS

| EP | 3116019 A1 | 1/2017 |
| WO | 2018069496 A1 | 4/2018 |

OTHER PUBLICATIONS

Int'l Search Report issued in PCT/EP2019/051015, dated Apr. 17, 2019.

(Continued)

*Primary Examiner* — Daniel P Shook
(74) *Attorney, Agent, or Firm* — MaxGoLaw PLLC

(57) ABSTRACT

A method for producing a printable ink for an electronic component in which a transition metal-containing pseudo-halide or chalcogenide is first complexed by a pyridine-like or thiol-like solvent, in order to improve or achieve solubility. Subsequently, by filtering and mixing with at least one solvent a printable ink is produced. The printable ink can be used to produce hole transport or electron blocking layers of electronic components.

20 Claims, 1 Drawing Sheet

Cu-SCN as a coordination polymer

○ Sulfur
● Nitrogen
● Carbon
● Copper

Coordination network of copper in Cu-SCN

(56) References Cited

OTHER PUBLICATIONS

Anand S. Subbiah et al. "Inorganic Hole Conducting Layers for Perovskite-Based Solar Cells" Journal of Physical Chemistry Letters, US, vol. 5, No. 10, May 15, 2014 (May 15, 2014), pp. 1748-1753.

* cited by examiner

Cu-SCN as a coordination polymer
Coordination network of copper in Cu-SCN
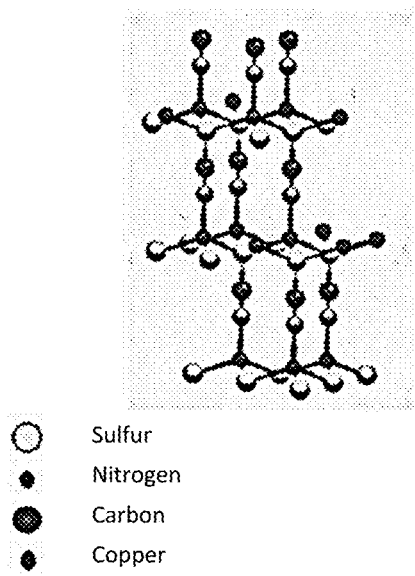
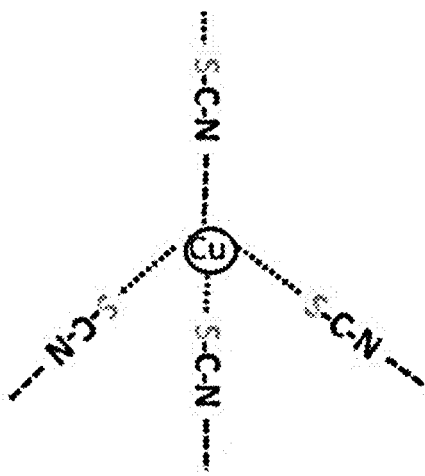
○ Sulfur
● Nitrogen
● Carbon
● Copper

SEMI-OXIDATIVE SOL-GEL PRINTING METHOD AND CORRESPONDING INK FORMULATIONS

The invention relates to a method for producing a printable ink for an electronic component, wherein a transition metal-containing pseudohalide or chalcogenide is first complexed by a pyridine-like or thiol-like solvent, in order to improve or achieve solubility. Subsequently, by filtering and mixture with at least one solvent a printable ink is produced.

The printable ink can be used to produce hole transport or electron blocking layers of electronic components, which shall also be covered by the invention.

BACKGROUND AND STATE OF THE ART

Organic light-emitting diodes (OLEDs) usually consist of a sandwich construction, with several layers of organic semiconducting materials between two electrodes. In particular, an OLED comprises one or more emitter layers (emitter layer EL), in which electromagnetic radiation, preferably in the visible range, is generated by a recombination of electrons with electron holes. The electrons and electron holes are each provided by a cathode or anode, respectively. Preferably, so-called injection layers facilitate the process by lowering the injection barrier. OLEDs therefore usually have electron or hole injection layers. Furthermore, OLEDs usually have electron and hole transport layers (HTL or ETL), which support the diffusion direction of the electrons and holes to the emitter layer. In OLEDs, these layers are made of organic materials. In hybrid optoelectronic components, the layers can partly consist of organic and partly of inorganic semiconducting materials. For linguistic simplification, hybrid LEDs, which can include organic and inorganic semiconductor layers, are also called organic light-emitting diodes (OLEDs).

Compared to conventional inorganic LEDs, OLEDs are characterized by a thin and flexible layer structure. For this reason, OLEDs can be used in a much wider range of applications than classic inorganic LEDs.

Due to their flexibility, OLEDs are ideal for use in applications such as displays, electronic paper or interior lighting.

The advantageous properties of optoelectronic components comprising organic semiconducting materials for light generation (OLEDs) can also be transferred to the generation of electric current. Organic solar cells or hybrid solar cells, for example, are also characterized by a thin layer structure, which significantly increases the possible applications compared to classic inorganic solar cells. The structure of organic solar cells or hybrid solar cells show similarities to OLEDs or hybrid LEDs. For linguistic simplification, hybrid solar cells of organic-inorganic layers are also subsumed under the term organic solar cells.

Instead of an emitter layer, however, one or more absorber layers are present as photoactive layer. In the absorber layer, electron-hole pairs are generated due to incident electromagnetic radiation. In contrast to inorganic solar cells, the organic emitter layer usually first forms so-called excitons, which are present as bound electron-hole pairs. These are subsequently separated into free charge carriers.

The other layers include electron and hole transport layers as well as electron extraction and hole extraction layers. These consist of organic materials or of organic and inorganic materials whose electrochemical potentials are shifted as donor and acceptor layers in such a way that they generate an internal field in the solar cell which separates the excitons and carries the free charge carriers to the electrodes. The incidence of electromagnetic radiation in the absorber layer thus provides electrons at the cathode and electron holes at the anode to generate a voltage or current.

Suitable air-stable hole transport layers for printing processes for the production of (opto-) electronic components such as organic light-emitting diodes (OLEDs), organic solar cells, but also for electronic components such as operational amplifiers (OPVs) and organic field effect transistors (OFETs) are not available or require very high process temperatures (e.g. NiO at over 350° C. or cross-linking polymers like TFB at over 190° C.) and therefore cannot be processed on flexible substrates like PET or PEN, which can only withstand temperatures up to 150° C. Furthermore, hole transport layers are located very far down in a normal component architecture, e.g. as a first or second layer and must be highly resistant to the printing of the other layers, which can be up to 6 additional layers and thus solvent combinations. Cross-link polymers are themselves very susceptible to processing in a normal environment and the electrical parameters of the components are strongly negatively affected.

Metal oxides offer a barrier against water and oxygen suitable for corresponding processes and for the stability of components, but suitable materials for the hole transport layer require either very high process temperatures (NiO above 350° C.), have too low hole mobilities (CuO, CuI), are n-type conductors (ZnO, VOx) or even insulators ($WO_3$) and/or cannot be produced with printing processes.

Recently, the class of pseudohalides has been identified as semiconductor material for optoelectronic components, with copper(I) thiocyanate (short: CuSCN) being of particular importance. It has already been shown that CuSCN can be processed from solution processes, whereby alkyl sulfides (di-n-propylsulfide etc.) have been used as solvents, since the material has not dissolved in any of the usual solvents, e.g. isopropanol.

Due to its strong chemical resistance, the material is ideally suited as a bottom layer in multilayer printed components. With suitable additives, the intrinsic hole mobility of CuSCN can be increased from 0.001 $cm^2$/V to up to 1.41 $cm^2$/V. Due to the very low HOMO (Highest Occupied Molecular Orbital; valence band in inorganic materials) of 5.4 eV, holes can be injected into very low valence bands or HOMO levels without an injection barrier, which is the case with blue fluorescent emitters and all phosphorescent emitters.

CuSCN is a pseudohalide and forms a coordination network as a crystal structure. It belongs to the class of coordination polymers, i.e. inorganic polymers. The central copper atom coordinates on three sides with the sulfur atom of the thiocyanate group and on another side with the nitrogen atom of the thiocyanate group. This type of bond gives the material its chemical resistance to most solvents and one is very limited in the choice of solvents to find a suitable ink formulation. The common alkyl sulfides are highly smelly, hazardous to health and have a too high evaporation rate to be used in printing processes. In a narrower sense, it has been shown that solvents that "dissolve" the CuSCN actually complex it, i.e. attack the coordination network of the material and replace the coordination sites. These newly generated complexes with the molecules of the solvent dissolve again in the solvent itself.

The pure CuSCN however never dissolves, but only the complexed form. On the other hand, many solvents do not form monomer complexes but 1D, 2D or even new 3D structures (1D=coordination polymer; 2D=individual surfaces), which also cannot be dissolved.

Recently it was shown that stable CuSCN color complexes with amine ligands can be produced and then processed from aqueous solution. However, the electrical parameters of the CuSCN layers produced in this way are disadvantageously altered (higher HOMO of 5.1 eV). The reason is an intrinsic oxidation of Cu(I) to Cu(II) by the protonating effect of the amine groups.

A processing of CuSCN or another transition metal containing pseudohalide or chalcogenide suitable for (opto-) electronic components into a printable ink without deterioration of its properties is not known so far. Thus, an efficient, simple, fast and cost-effective processing for an industrial printing of these particularly suitable semiconductor materials to (opto-) electronic components is not yet possible.

OBJECTIVE OF THE INVENTION

The objective of the invention is to provide a method for producing a printable ink, in particular for (opto-) electronic components, without the disadvantages of the state of the art. In particular, it was an objective of the invention to provide a method for the production of a printable ink in particular for (opto-) electronic components, which enables the use of new materials and a control of their electrical properties. Furthermore, one objective of the invention was to provide alternative solvent formulations for printable inks comprising transition metal-containing pseudohalides or chalcogenides. A further objective of the invention was to provide (opto-) electronic components with semiconductor materials which have particularly favorable electrical properties and can be produced quickly, efficiently, easily, improved and at low cost.

SUMMARY OF THE INVENTION

In a first aspect, the invention relates to a method comprising the following steps:
  a) Providing a transition metal-containing pseudohalide or chalcogenide as a solid
  b) Providing a pyridine-like or thiol-like solvent
  c) Mixing the pseudohalide or chalcogenide with the pyridine-like or thiol-like solvent to form pseudohalide or chalcogenide-containing complexes
  d) Filtering the pseudohalide or chalcogenide complexes from the mixture from the previous step
  e) Mixing the pseudohalide or chalcogenide-containing complexes with the pyridine-like or thiol-like solvent and/or with one or more other solvents to produce a printable ink.

The first step is to provide a transition metal containing pseudohalide or chalcogenide as a solid. A preferred example of a transition metal-containing pseudohalide is a metal thiocyanate, especially copper(I) thiocyanate.

The chemical elements with atomic numbers from 21 to 30, 39 to 48, 57 to 80 and 89 to 112 are preferably called transition metals. A preferred example of a transition metal-containing chalcogenide is a sulfide, e.g. aluminum sulfide.

Preferably, the transition metal-containing pseudohalides or chalcogenides are generally compounds of the structure M-L, where in particular M=transition metal and L=chalcogen or pseudohalogen.

A transition metal containing pseudohalide copper(I) thiocyanate is preferred.

The pyridine-like solvent preferably comprises simple pyridines with alkyl group and/or halogens as side groups, e.g. selected from the group comprising 3-methylpyridines, 4-methylpyridines, 2-methylpyridines, 3-ethylpyridines, 4-ethylpyridines, 2-bromopyridines, 3-bromopyridines, 2-hydroxy-3-methylpyridines and/or 4-tert-butyl-pyridines.

Pseudohalides are preferably a group of multiatomic, resonance-stabilized, monovalent anions with preferably largely symmetrical charge distribution, which behave in a distinct halide analogy. The pseudohalides preferably comprise linear anions $X^-$, such as cyanide $[CN]^-$, fulminate $[CNO]^-$, cyanate $[NCO]^-$, thiocyanate $[NCS]^-$, selenocyanate $[NCSe]^-$, tellurium cyanate $[NCTe]^-$ and azide $[NNN]^-$, nonlinear anions, such as dicyanamide $[N(CN)_2]^-$, dicyanophosphide $[P(CN)_2]^-$, tricyanomethanide $[C(CN)_3]^-$ and nitrosodicyanomethanide $[NOC(CN)_2]^-$ as well as anionic transition metal complexes such as tetracarbonyl cobaltate $[Co(CO)_4]^-$ and pentacarbonyl manganate $[Mn(CO)_5]^-$.

Similar or identical behaviour and/or properties of pseudohalides to halides are preferred.

Halogenides are preferably chemical compounds between elements of the seventh main group (more precisely the 17th group) of the periodic table, the so-called halogens, and elements of other groups.

Transition metal-containing chalcogenides preferably comprise chalcogens (especially oxygen, sulfur, selenium, tellurium, polonium and/or livermorium) as formal anions with transition metals or more electropositive transition metals. Preferred transition metal-containing chalcogenides are transition metal sulfides.

Pseudohalides and chalcogenides containing transition metals have particularly good electrical and chemical properties to produce a robust (opto-) electronic component with improved electrical properties.

A pyridine-like solvent is preferably a solvent that has properties, especially chemical properties, that essentially correspond to those of a pyridine.

A pyridine-like solvent includes in particular a pyridine. A pyridine is preferably a colorless and highly flammable chemical compound with the molecular formula $C_5H_5N$. It preferably forms the simplest azine, which consists of a six-membered ring (preferably called the pyridine ring) with five carbon atoms and one nitrogen atom.

Preferably, the pyridine-like solvent comprises pyridine in which at least one position of the pyridine ring is substituted by a group selected from a group comprising an alkyl group, a carboxyl group, an acetyl group, a hydroxyl group and/or a thiol group and/or a halogen.

Pyridine and/or the pyridine-like solvent preferably forms complexes with numerous transition metal ions. Pyridine preferably coordinates with the free electron pair of the nitrogen atom to the metal center.

Complex coordination networks or coordination compounds are preferably composed of one or more central particles and one or more ligands. The central particles are mostly atoms or ions of transition metals, which can be uncharged or charged. In complexes, the ligands preferably contribute all electrons to the bond. Central particles of complexes contain advantageously transition metals. These have, for example, corresponding free d-orbitals with which the ligands can bind. Examples of central particles are cationic central ions such as $Cu^{2+}$, $Mg^{2+}$, $Fe^{2+}$, $Fe^{3+}$, $Ni^{2+}$ etc.

A thiol-like solvent is preferably a solvent that has properties, especially chemical properties, that essentially correspond to those of a thiol.

Thiols are preferably thioalcohols and/or thiophenols. Thioalcohols are in particular organic-chemical compounds which have one or more aliphatically or aromatically bound thiol groups (also mercapto groups) (—SH) as functional groups. Thioalcohols correspond to alcohols in which the oxygen atom has been replaced by a sulfur atom. Thiophenol is preferably an organic sulfur compound. Thiophenols are in particular a group of compounds that have a thiol group (—SH) on a benzene ring. Thiols preferably have metal-complexing properties, especially transition metal-complexing properties.

A thiolar solvent is preferably selected from the group of aliphatically or aromatically bound thiols, which are liquid under standard conditions. An example of a thiolar solvent is thiolanisole.

A pyridine-like and/or thiol-like solvent is especially a solvent which forms complexes with a transition metal-containing pseudohalide or chalcogenide.

After mixing transition metal-containing pseudohalide or chalcogenide with the pyridine-like and/or thiol-like solvent and complexing preferred therefrom (pseudohalide or chalcogenide-containing complexes are formed), these complexes are preferably filtered from the mixture. The pseudohalide and/or chalcogenide may be present as a solid after complexation and is filtered out by a filter paper or precipitated from the solution by adding short alcohols such as methanol, ethanol and/or isopropanol to the mixture and subsequently filtered out by a filter paper in the next step.

Preferably, it is the complexing of the transition metal-containing pseudohalide or chalcogenide which allows for dissolving the formed complexes in at least one solvent to produce a printable ink.

Especially through the step of filtering, the complexes are available for mixing with a suitable solvent. By means of said steps the objective is solved to provide transition metal-containing pseudohalides or chalcogenides, which have advantageous physical and/or chemical properties, especially for (opto-) electronic components, which are dissolved in at least one solvent and allow for producing a printable ink.

For mass production of (opto-) electronic components, wet chemical deposition processes (preferably also called wet process), like printing processes, are efficient, practical and cost-effective. Here, a preferably liquid processing of the deposited (semiconductor) materials takes place. For this purpose, the materials are preferably dissolved in appropriately selected solvents.

Well-known wet chemical processes are for example the spin coating process (i.e. rotational coating), where the substrate is applied on a turntable and solutions with polymers or small molecules can be applied evenly by spinning. In the dip coating process, a substrate is dipped into a coating solution. When it is pulled out, a liquid film remains on the substrate so that the layers can be applied one after the other.

In addition, printing processes such as ink-jet printing, slot die coating and blade coating are characterized by particularly high flexibility at low production costs.

While doped semiconductor materials can also be applied in the spin coating or dip coating process, this is not possible on an industrial scale with conventional printing processes. The doping of the organic semiconductors creates aggregates in the solution, which prevent or at least greatly complicate effective printing. This leads to blockages in the print heads. These can be reduced by filtering processes, but this filtering of the aggregates leads to a cancellation of the desired doping. Therefore, a possible simple doping as well as its control of an already applied layer are especially advantageous. This procedure is also described below.

In the broadest sense, the term printing process is used to cover all processes for the reproduction of physical or electronic artwork, whereby a substrate of semiconductor materials can be applied in the form of a printing ink. The term printing process can also be used in the broadest sense to describe all processes for the reproduction of physical or electronic artwork in which semiconductor materials can be applied to a substrate in the form of a printing ink. For the purposes of the invention, the term printing ink or ink is preferably understood to mean a composition which is liquid at room temperature and comprises or consists of a (semi-conductor) material and a carrier. The carrier is preferably a solvent or solvent mixture in which the semiconductor material to be printed is dissolved, so that the at least one layer for the optoelectronic component applied by this means can be applied by common printing methods.

Printing processes that can be considered are, for example, offset printing, screen printing, flexographic printing or, in particular, ink jet printing processes and/or slot die coating processes. In contrast to evaporation processes, for example, the printing processes are particularly suitable for mass production. In addition, the process is particularly cost-effective.

After complexing and filtering, the pseudohalide or chalcogen-containing complexes are preferably mixed with the pyridine-like or thiol-like solvent and/or with one or more other solvents to produce a printable ink. The pyridine-type or thiol-type solvent may correspond to the pyridine-type or thiol-type solvent used for complexation (step c)). It may also be another (different) pyridine-type or thiol-type solvent. The other solvent(s) may preferably be an agent used in addition to the pyridine-type or thiol-type solvent used, but may also be used as at least one solvent without a pyridine-type or thiol-type solvent in step (e). The solvents used may preferably be selected according to the preferred behaviour of the ink. Preferably, the solvents shall actually dissolve the complexes formed. In contrast to uncomplexed transition metal-containing pseudohalide or chalcogenide as solid, this is advantageously possible in a straight forward manner.

It may also be preferable that the pyridine-like or thiol-like solvent used for complexation is also used directly as one of the at least one solvent of the ink, so that sometimes (depending on the pyridine-like solvent) filtering is not necessary, thus eliminating the step of filtering and possibly subsequent mixing.

It may be preferable to use the same pyridine-like or thiol-like solvent for mixing in step e) as already used for complexing. Nevertheless, it is preferable to perform a preliminary filtration. On the one hand, the purity of the pseudohalide or chalcogenide can be improved by filtering out, since the filtered-out materials are preferably only the complexes. Therefore, impurities are preferably not filtered out and are preferably avoided in the printable ink. Only substances or impurities that are also complexed by the solvent would preferably be filtered out. In addition, the degree of oxidation of the metal atom during the complexing step, may be influenced by a ratio of pseudohalide or chalcogenide to the complexing solvent is a preferred po to influence as described below. For example, when complexing in a solution with a high quantity of pseudohalide or chalcogenide (concentrations above 10 grams per liter), i.e. a high ratio, many more metal atoms, e.g. Cu(I)SCN, are oxidized to a higher oxidation state or oxidation number, e.g. in Cu(II)SCN$^-$, than when complexing is performed with lower concentrations, e.g. less than 1 gram of pseudohalide or chalcogenide per liter (g/L), i.e. a low ratio. The material in the higher oxidation state preferentially means doping and therefore the degree of doping can preferably be controlled by this process. For these reasons, a different ratio of pseudohalide or chalcogenide to the pyridine-like or thiol-like solvent may be desired during oxidation than during the subsequent mixing with at least one solvent in step e).

Furthermore, during complexing, the pyridine- or thiol-like solvent is preferably also co-oxidized and undesirable pyridine N-oxides are formed, which have very high boiling temperatures and negatively influence the ink, e.g. by a too high boiling temperature of over 270° C., which makes drying at the desired process parameters more difficult and/or prevents it. By filtering the complexed crystals, it is therefore possible to prevent the pyridine N-oxides from being present in the solution. A preferred description of the reaction taking place during complexing is:

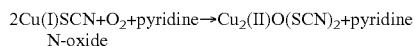

$$2Cu(I)SCN+O_2+pyridine \rightarrow Cu_2(II)O(SCN)_2+pyridine\ N\text{-oxide}$$

As an example, we will now describe the production process of a concrete ink using copper(I) thiocyanate (CuSCN) as a transition metal-containing pseudohalide: it was found that the complexation of CuSCN with some solvents as ligands creates a new material which can be filtered out separately and then processed into an ink in new solvents. Furthermore, this material can be decomposed again to CuSCN at mild temperatures (<120° C.) and is stable up to 70° C. in air. Preferably, solvents that complex CuSCN can also be used directly as solvents for the newly formed complexes. Depending on the molar proportions of the solvent, a partial oxidation of Cu(I) to Cu(II) can be achieved. In this way, doping of the CuSCN layer with Cu(II) oxide can be deliberately created, thus increasing the charge carrier density and mobility. One can have an oxidation during the printing process, if desired, or not. Preferably, one can control the degree of oxidation and thus control the doping of the generated layers with oxygen. Suitable solvents for this purpose are simple pyridines with alkyl groups and/or halogens as side groups, e.g. 3-methylpyridines, 4-methylpyridines, 2-methylpyridines, 3-ethylpyridines, 4-ethylpyridines, 2-bromopyridines, 3-bromopyridines, 2-hydroxy-3-methylpyridines, 4-tert-butylpyridines, etc. This solvent class interferes with the CuSCN network and coordinates the CuSCN to form monomers that can then be dissolved. These complexes can then be used to create an ink for printing the CuSCN layer. The fact that mixing the CuSCN with the above-mentioned pyridine-like solvents is not a conventional solution but a complexation is preferably quickly recognized by the color change. The CuSCN is a colorless material and the pyridine-like complexes of the CuSCN are strongly coloring (yellow, orange, green, etc.). In a narrower sense, this is preferably a "sol-gel process" in which oxidation is prevented or only occurs in a controlled manner Up to now, sol-gel processes are known in the prior art only for metal oxides or other oxidized materials.

The corresponding ink formulations contain the complexed and dissolved (not dispersed!) pseudohalide (and/or another inorganic solid such as magnesium sulfide; MgS or copper(I) oxide; $Cu_2O$), the complexing pyridine-like solvent (such as 3-methylpyridine) and other solvents that improve the printing and film forming properties during drying, such as tert-butanol.

The resulting ink can be adapted individually to the most diverse requirements, both in terms of processing/applying the ink (temperature, moisture/composition of ambient atmosphere, drying time, etc.). Printable inks with improved printing and electrical properties can be provided, especially for the production of (opto-) electronic components such as OLEDs, OFETs, OPVs and organic solar cells.

However, the manufacturing method of the ink itself has also been simplified and improved. Only a few steps are required to produce a printable ink comprising transition metal containing pseudohalides or chalcogenides as solids, while at the same time there is a high degree of flexibility in the choice of solvents used to produce a printable ink. It is advantageous not to use strong smelling and/or hazardous solvents as in the state of the art.

In summary, the innovation of the invention concerns the process of complexing pseudohalides with pyridine-like ligands in order to make them soluble and thus be able to be processed by printing processes. The pyridine-like ligands can be repelled at very mild temperatures (<150° C.) and the insoluble starting material is again present after thermal treatment. The material copper(I)-thiocyanate (short: CuSCN), which is a very good p-semiconductor (hole mobilities from $10^{-5}$ $cm^2/V$ to 1.4 $cm^2/V$), preferably has very low hole transport levels (HOMO ~5.4 eV) and is in the true sense of the word is absolutely insoluble. It is suitable as hole transport layer for optoelectronic components such as OLEDs, OPVs, OFETS etc. In addition, the complexation with the pyridine-like ligands includes the creation of a printable ink for functional printing with ink jet, slot die and similar processes.

In a preferred embodiment, the invention relates to a process comprising the following steps:
a) Providing a copper(I) thiocyanate as a solid
b) Providing a pyridine-like or thiol-like solvent
c) Mixing the copper(I) thiocyanate with the pyridine-like or thiol-like solvent to form copper(I) thiocyanate-containing complexes
d) Filter the copper(I) thiocyanate complexes from the mixture from the previous step
e) Mixing the copper(I) thiocyanate-containing complexes with the pyridine-like or thiol-like solvent and/or with one or more other solvents to produce a printable ink.

Copper(I) thiocyanate (CuSCN) in particular has exceptionally good electrical, chemical and/or mechanical properties for (opto-) electronic components, which can be easily and flexibly printed or wet-chemically produced due to this design. Due to its strong chemical resistance, the material is well suited as a bottom layer in multilayer printed components. The intrinsic hole mobility of CuSCN can be increased from 0.001 $cm^2/V$ to up to 1.41 $cm^2/V$ by suitable additives. Due to the very low HOMO (Highest Occupied Molecular Orbital; valence band in inorganic materials) of 5.4 eV, holes can be injected into very low valence bands or HOMO levels without an injection barrier, which is the case with blue fluorescent emitters and all phosphorescent emitters.

In a preferred embodiment of the invention, the pseudohalide is a metal thiocyanate and/or metal isothiocyanate preferably selected from a group comprising sodium thiocyanate, potassium thiocyanate, silver thiocyanate, calcium thiocyanate, tungsten thiocyanate, vanadium thiocyanate, molybdenum thiocyanate, silicone thiocyanate and/or other (transition) metal thiocyanates, most preferably a copper (I) thiocyanate.

Sodium thiocyanate is preferably a chemical compound with the formula NaSCN, which is a solid at room temperature.

Potassium thiocyanate (KSCN, also: potassium rhodanide) is preferably a salt of thiocyanic acid.

Calcium thiocyanate preferably has the chemical formula $C_2CaN_2S_2$

Silver thiocyanate, preferably AgSCN, is preferably a white, coordination polymeric compound with a zigzag chain structure.

The other metal thiocyanates listed are also known to a person skilled in the art.

These materials have particularly preferred electrical and chemical properties, such as a deep-lying HOMO and strong chemical resistance, which is particularly advantageous in manufacturing processes for components with several layers.

In another preferred embodiment of the invention, the pseudohalide is selected from the group consisting of metal cyanide, metal fulminate, metal cyanate, metal selenocyanate, metal tellurium cyanate and/or metal azide.

These materials allow high flexibility in the production of components with customized electrical properties.

In another preferred embodiment of the invention, the pseudohalide is a non-linear metal anion, preferably selected from the group comprising metal dicyanamide, metal dicyanophosphide, metal tricyanomethanide and/or metal nitrosodicyanomethanide.

An anion is preferably a negatively charged ion.

A nonlinear metal anion is preferably an anion that does not have a linear molecular geometry. In chemistry, linear molecular geometry preferably describes a geometry around a central atom that is bonded to two other atoms (or ligands) that have a bond angle of 180°. An example of a linear organic molecule is acetylene (HC≡CH). Nonlinear metal anions have preferred chemical properties.

In another preferred embodiment of the invention, the chalcogenide is a sulfide preferably selected from a group comprising cadmium sulfide, zinc sulfide, molybdenum disulfide, silicon disulfide, tungsten disulfide, aluminum sulfide and/or vanadium sulfide.

A sulfide is preferably a salt or alkyl or aryl derivative of hydrogen sulfide ($H_2S$). The salts belong in particular to the group of metal-sulfur compounds and preferably contain the sulfide anion $S^{2-}$ as a component.

Cadmium sulfide is preferably a chemical compound of cadmium and sulfur and belongs to the II-VI compound semiconductor group.

Zinc sulfide or zinc(II) sulfide (ZnS) is preferably the zinc salt of hydrosulfic acid and a II-VI compound semiconductor. Due to its high refractive index, it can often be used in optoelectronic components as an electrical and optically relevant layer at the same time and is luminescent.

Molybdenum(IV) sulfide, or molybdenum disulfide ($MoS_2$) is preferably a gray-black, crystalline sulfide of the chemical element molybdenum and preferably exhibits graphite-like properties.

Silicon disulfide is preferably an inorganic chemical compound of silicon from the group of sulfides.

Tungsten disulfide or tungsten(IV) sulfide is preferably a chemical compound from the group of tungsten compounds and sulfides.

Aluminium sulfide ($Al_2S_3$) is preferably a chemical compound from the group of sulfides. Vanadium sulfide or vanadium sulfides are preferably inorganic chemical compounds of vanadium from the group of sulfides. Preferably it comprises vanadium sulfide ($V_2S_2$), vanadium(III) sulfide ($V_2S_3$), vanadium(IV) sulfide ($VS_2$), vanadium(V) sulfide ($V_2S_5$) and/or patrónite ($VS_4$).

The embodiment is suitable for particularly efficient components due to improved electrical properties.

In a further preferred embodiment of the invention, the transition metal-containing pseudohalide or chalcogenide is a material described above, in particular a metal thiocyanate or metal isothiocyanate, preferably selected from a group comprising sodium thiocyanate, potassium thiocyanate, silver thiocyanate, calcium thiocyanate, tungsten thiocyanate, vanadium thiocyanate, molybdenum thiocyanate, Silicone thiocyanate and/or other metal thiocyanates, preferably a copper (I) thiocyanate, wherein in step c) doping of the material is effected by partial oxidation of the metal, preferably copper (I) to copper (II), and the extent of oxidation at complexation is controlled by the ratio of solid to pyridine-like or thiol-like solvent, a higher ratio representing increased oxidation.

Preferably, oxidation provides doping for the materials used. In particular, an oxidation provides a p-doping. An oxidation preferably means an increased oxidation number or level. The degree of oxidation preferably describes the proportion of the pseudohalide or chalcogenide contained in the transition metal containing ink, which is oxidized and which can be described e.g. in %.

However, whether the doping is advantageous depends on the material or its use. A p-doping in the case of Cu(I)SCN to Cu(II)SCN—is advantageous, for example, because the material improves its hole transport properties and should preferably be used for printing a hole transport layer. Therefore, oxidation is especially preferred for doping hole transport layers to be printed.

However, material cases could preferably occur where p-doping is performed in a material, which is preferably used as an electron transport layer, then it would preferably be disadvantageous. However, it could be used there e.g. for a reduction of an n-doping to control the strength of this n-doping. By controlling the ratio as described for complexing, the degree of doping can advantageously be controlled very precisely. Concentrations of less than 1 g/L oxidize preferentially to a lower proportion and thus cause a low doping.

Higher concentrations preferably oxidize more material, which in particular results in higher doping. The concentration is preferably given in grams per liter. Low concentrations are preferably below 1 g/L and preferably result in low oxidation and high concentrations are preferably above 10 g/L and preferably result in high oxidation.

This embodiment may preferably also refer to a pseudohalide selected from the group consisting of metal cyanide, metal fulminate, metal cyanate, metal selenocyanate, metal tellurium cyanate and/or metal azide, a pseudohalide which is a non-linear metal anion, preferably selected from the group consisting of metal dicyanamide, metal dicyanophosphide, metal tricyanomethanide and/or metal nitrosodicyanomethanide and/or a chalcogenide which is a sulfide preferably selected from a group comprising cadmium sulfide, zinc sulfide, molybdenum disulfide, silicon disulfide, tungsten disulfide, aluminum sulfide and/or vanadium sulfide.

In another preferred embodiment of the invention, the pyridine-like solvent is a pyridine in which at least one position of the pyridine ring is substituted by a group selected from a group comprising an alkyl group, a carboxyl group, an acetyl group, a hydroxyl group and/or a thiol group and/or a halogen.

A substitution preferably refers to a chemical reaction in which an atom or group of atoms in a molecule is replaced by another atom or group of atoms.

An alkyl group is preferably at least one part of a molecule, which consists of carbon and hydrogen atoms connected to each other. An example in the form of a simple alkyl group is a methyl group —$CH_3$. Other examples are preferably the ethyl group —$CH_2$—$CH_3$ and the n-propyl group —$CH_2$—$CH_2$—$CH_3$. A general formula for alkyl groups is preferably $CnH_{2n+1}$.

The carboxyl group is preferably the functional group —COOH of carboxylic acids.

An acetyl group preferably denotes the following chemical structure: —$C(O)CH_3$ and is composed of a carbonyl and a methyl group.

The hydroxyl group (—OH) is preferably the functional group of alcohols and phenols.

The thiol group (—SH) is preferably a functional group analogous to the hydroxyl group (—OH), whereby the strongly electronegative oxygen atom is replaced by the less electronegative sulfur atom.

A halogen preferably forms the 7th main group of the periodic table of the elements and comprises the following six elements: fluorine, chlorine, bromine, iodine, astatine and tennessine.

Preferably, an alkyl group, a carboxyl group, an acetyl group, a hydroxyl group, a thiol group and/or a halogen may occur as a side group of the pyridine. A halogen can also be additionally substituted at the mentioned groups.

In organic chemistry, a side group or chain preferably denotes a substituent of a main chain and/or cyclic group, e.g. a short carbon chain (alkyl group) branching off from a longer carbon chain or ring.

The pyridine-like solvents of this preferred embodiment described above are particularly well suited for fast and easy complexation of transition metal-containing pseudohalides or chalcogenides.

In another preferred embodiment of the invention, the pyridine-like solvent is selected from a group comprising methylpyridines, ethylpyridines, bromopyridines and/or tert-butylpyridines.

The methyl pyridines preferably form a substance group of organic compounds, which belongs to the heterocycles (more precisely: heteroaromatics). It preferably comprises a pyridine ring which is substituted with a methyl group (i.e. preferably an alkyl group). Methyl pyridines have similar properties to pyridine.

Ethylpyridines preferably have the formula $C_7H_9N$. Examples of ethylpyridines preferably include 2-ethylpyridine, 3-ethylpyridine and/or 4-ethylpyridine.

An example of a bromopyridine is preferably 2-bromopyridine, which belongs to the heterocycles (more precisely: heteroaromatics) and preferably comprises a pyridine ring that is substituted with bromine in the 2-position.

An example of tert-butylpyridines is 2,6-di-tert-butylpyridine, an organic compound which preferably belongs to the heterocycles (more precisely: heteroaromatics) and comprises a pyridine ring which has two tert-butyl radicals in the 2- and 6-position.

The embodiment is not only suitable for efficient complexing, but also exhibits improved solution properties.

In another preferred embodiment of the invention, the thiol-like solvent is selected from a group comprising thiolanisols, alkylthiophenes, allylthiophenes and/or thioglycolic acids.

Thioanisole is preferably a chemical compound from the group of thioethers, in particular a sulfur analog of anisole and preferably has the molecular formula $C_7H_8S$.

An example of an alkylthiophene is preferably poly(3-alkylthiophenes).

An example for allylthiophenes is preferably 2-allylthiophenes, also with the molecular formula $C_7H_8S$.

Thioglycolic acid is preferably a colorless, viscous liquid, which belongs to the group of thiols. Thioglycolic acid preferably has the molecular formula $C_2H_4O_2S$.

Solvents of this type have improved printing properties.

In another preferred embodiment of the invention, the printable ink
 a) 0.1-10% by weight of pseudohalide containing complexes and
 b) 5-99.9% by weight of the pyridine-like or thiol-like solvent,
wherein the % by weight refers to the total weight of the ink and the sum of the % by weight is less than or equal to 100.

Other components, especially other solvents, may be included.

This mixture has proven to be particularly suitable for the production of an electrically very powerful layer as part of an (opto-) electronic component and is particularly well suited for use in commercially available printers.

In another preferred embodiment of the invention, the printable ink comprises
 a) 0.1-10% by weight of pseudohalide or chalcogenide-containing complexes
 b) 5-99.7% by weight of the pyridine-like or thiol-like solvent,
 c) 0.1-50% by weight of a second solvent which is liquid at standard conditions,
 d) 0.1-50% by weight of a third solvent which is liquid at standard conditions
wherein the % by weight is based on the total weight of the ink and the sum of the % by weight is less than or equal to 100.

Standard conditions are preferably 273.15 K and 1013.25 hPa.

The embodiment yields an increased flexibility to create desired ink properties, which can be controlled in particular by adding the second and third solvents. Solvents that are liquid under standard conditions are particularly well suited for this purpose. At the same time, these properties reduce the demands on the structure for production with regard to the second and third solvent, since standard conditions are particularly easy to create.

In another preferred embodiment of the invention, the second solvent increases the printability of the ink, the second solvent being a solvent with a lower surface tension at standard conditions than the pyridine-like or thiol-like solvent.

The surface tension preferably describes the phenomenon that occurs with liquids as a result of molecular forces to keep their surface small. The surface of a liquid behaves like a taut, elastic film, for example.

The surface tension is preferably defined by a stirrup of width L, in which a film of liquid is clamped. If the liquid film is pulled apart by a force F parallel to the surface and perpendicular to L by dx, the surface tension is preferably proportional to the force and is preferably y=F/2L.

A person skilled in the art knows various ways of determining the surface tension of different substances under standard conditions, e.g. by looking up in a table, by calculation and/or measurement, e.g. by using a bracket described above, with a tensiometer, by means of the capillary effect and/or by measuring the contact angle.

By suitable selection of the second solvent according to this design, the printability can be positively influenced due to the reduction of the surface tension of the mixture and e.g.: finer structures can be printed.

Printability refers preferably, e.g. in the case of inkjet printing, to the fact that during printing the formation of droplets at the inkjet nozzles takes place with essentially the same volume, with the same spray angle vertically downwards and at the same speed. Furthermore, the droplets should preferably exhibit essentially the same behavior when the nozzles are switched off and then switched on again. Furthermore, the behavior of the droplets at the nozzles should not change over time, e.g. the spray angle, the volume or the speed.

Terms such as essentially, approximately, roughly, ca., etc. preferably describe a tolerance range of less than ±40%, preferably less than ±20%, especially preferred less than ±10%, even more preferred less than ±5% and especially less than ±1%. Similarly describes preferably sizes which are approximately the same. Partially describes preferably at least 5%, particularly preferably at least 10%, and especially at least 20%, in some cases at least 40%. If, for example, it is disclosed herein that a spray angle at a printer nozzle essentially does not change, this preferably means that the spray angle remains constant within the given tolerance ranges mentioned.

Solvent combinations are preferably used for this purpose, whereby each of the solvents usually has a positive effect on one of the parameters mentioned for the printability of the ink.

The preferential addition of a solvent with a lower surface tension at standard conditions than the pyridine-like or thiol-like solvent will advantageously lower the total surface tension of the solution. Lower surface tension results in more stable ejection of droplets from the printhead nozzles in a perpendicular line to the substrate, rather than uncontrolled lateral spraying of the droplets from the printhead.

As an analogy, one can imagine the addition of a "surfactant" or surfactant or wetting agent to mixtures, whereby preferably the wettability should be increased and/or the surface tension should also be reduced. In this case, the ink should be able to wet the print head material well, so that a stable ejection of the ink from the print head can take place, and the ink should preferably also be able to wet the material on which it is printed well, so that no defects in the printed film occur, i.e. preferably a uniform, homogeneous film is produced.

In another preferred embodiment of the invention, the third solvent increases the drying time of the ink, wherein the third solvent is a solvent with a higher viscosity at standard conditions than the pyridine-like or thiol-like solvent.

Viscosity preferably refers to the viscosity of liquids and/or gases (fluids). Preferably, the higher the viscosity, the thicker the fluid is; the lower the viscosity, the thinner the fluid is.

The viscosity of certain substances at standard conditions is preferably known for many materials. Furthermore, it can be easily determined by a person skilled in the art, e.g. by measurement, e.g. with a viscometer (e.g. according to EN ISO 3219) and/or a rheometer.

The embodiment can be advantageously used to significantly improve the drying ability of the ink. This means in particular that the drying time is increased or the drying speed is reduced.

An increased viscosity preferably reduces the drying speed. Preferably, the ink does not dry too quickly, as otherwise it could dry on the print head nozzles, for example. This is a widespread problem in inkjet printing. A too fast and uncontrolled drying of the wet film after printing will especially create inhomogeneities in the dry film, which has a strong negative influence on the electrical parameters of the components.

Preferably, the drying time and/or the drying speed and thus preferably the solvent combination is selected in such a way that the ink does not dry too slowly at the same time, so that the drying times and thus the production speed are not limited.

A further advantage of increasing the viscosity of the ink by adding a suitable third solvent after this design is that the highest possible viscosity in the printed wet film prevents the wet film from melting, which is advantageous and thus increases the print quality and preferably the component quality.

Viscosity should therefore preferably be a trade-off between high viscosity and thus preferably stable print image, and an increased printing or production speed, preferably accompanied by lower viscosity, and preferably increased print stability at the print head.

As an example, a solvent mixture is given with 50% vol. (volume percent) tetrahydronaphthalene (tetralin)+50% vol. toluene. Tetralin has a high surface tension, which, together with the increased surface tension of the pyridine- and/or thiol-like solvent, causes a "dewetting" of the wet film on many substrates. Toluene with a lower surface tension than the pyridine- and/or thiol-like solvent is added to improve wetting of the wet film on the printing substrate. At the same time, toluene preferably has a lower viscosity than the pyridine- and/or thiol-like solvent and without addition, the printed wet film on the printing substrate could melt. Tetralin, which preferably has a higher viscosity than the pyridine and/or thiol-like solvent, increases the viscosity of the mixture and the wet film can better retain its printed form on the printing substrate. Furthermore, the ink dries too quickly only with the addition of toluene, preferably alone, and the nozzles on the print head would dry out after a short time. Advantageously, the addition of tetralin to the mixture prevents such premature drying out.

An example of a preferred mix of a printable ink is as follows:

| | |
|---|---|
| Complexed pseudohalide or other inorganic solid | 0.01%-10% |
| Complexing pyridine-like solvent | 5%-100% |
| Solvent to improve printing | 5%-50% |
| Solvent to improve drying | 5%-50%. |

Wherein % preferably refers to % by weight.

In a further aspect, the invention relates to a printable ink producible by a method (process) as described above.

The average person skilled in the art recognizes that technical features, definitions and advantages of preferred embodiments of the inventive method (process) also apply to the inventive ink and its embodiments.

In a further preferred embodiment of the method according to the description above, a layer is produced in a subsequent step f) by applying the printable ink by means of a printing process and/or wet process.

This layer can preferably be applied e.g. on a substrate or on an already applied further layer of an (opto-) electronic component. Preferably, this layer is a functional layer of the component and fulfils an electrical function, e.g. as hole transport layer and/or electron block layer.

In a further preferred embodiment of the method according to the invention, a thermal treatment of the layer produced in step f) is carried out at a temperature between 50° C. and 180° C., preferably between 120° C. and 180° C., particularly preferably between 110° C. and 150° C.

A thermal treatment can preferably be carried out by a heating element and/or electromagnetic radiation, e.g. by a thermal (infrared) or UV radiator. At the temperatures it can preferably be achieved that the pseudohalide containing or chalcogenide containing complexes change back into the original transition metal containing pseudohalides or chalcogenides.

The CuSCN complex can be decomposed back to CuSCN at mild temperatures (<120° C.), for example. In this way, the desired electrical properties can be achieved again, which may have changed during the complexation process.

In a further preferred embodiment of the process according to the invention, the transition metal-containing pseudohalide or chalcogenide is a material described above, in particular a metal thiocyanate or metal isothiocyanate, preferably selected from a group comprising sodium thiocyanate, potassium thiocyanate, silver thiocyanate, calcium thiocyanate, tungsten thiocyanate, vanadium thiocyanate, molybdenum thiocyanate, silicone thiocyanate and/or other metal thiocyanates, particularly preferably a copper(I) thiocyanate, and the thermal treatment within the layer results in doping of the material by partial oxidation of the metal, preferably copper(I), to copper(II).

Thermal treatment, e.g. as described above, preferentially results in doping of the layer. This can advantageously increase the mobility and/or number of dominant charge carriers, which has a positive effect on the electrical properties of the component. In the example of CuSCN a partial oxidation of Cu(I) to Cu(II) can be achieved. In this way, doping of the CuSCN layer with Cu(II) oxide can be deliberately created, thus increasing the charge carrier density and mobility.

Preferably, the amount of doping can be controlled by the amount of partial oxidation.

This embodiment may preferably also refer to a pseudohalide selected from the group consisting of metal cyanide, metal fulminate, metal cyanate, metal selenocyanate, metal tellurium cyanate and/or metal azide, a pseudohalide which is a non-linear metal anion, preferably selected from the group consisting of metal dicyanamide, metal dicyanophosphide, metal tricyanomethanide and/or metal nitrosodicyanomethanide and/or a chalcogenide which is a sulfide preferably selected from a group comprising cadmium sulfide, zinc sulfide, molybdenum disulfide, silicon disulfide, tungsten disulfide, aluminum sulfide and/or vanadium sulfide.

In a further preferred embodiment of the method according to the invention, the extent (degree) of oxidation during thermal treatment is controlled by
a) the saturation of the ambient atmosphere with oxygen, whereby more oxygen means increased oxidation and/or
b) the rate of temperature change over time during thermal treatment, whereby a higher positive rate of change until the final bakeout temperature means increased oxidation.

Thus, the oxidation and thus the doping can be controlled particularly precise and flexible via two different parameters. It is preferred that a minimum saturation with oxygen is given in any case, since without oxygen typically no oxidation takes place.

The saturation of the ambient atmosphere with oxygen preferably refers to the proportion of oxygen in the atmosphere within the physically possible range due to the basic composition of the atmosphere and the physical conditions such as pressure and/or temperature. A higher proportion preferably means a higher saturation. A person skilled in the art knows how to control the oxygen saturation of an atmosphere, e.g. in a closed volume.

Also, a precise control of the temperature and thus also the control of its rate of change over time is routinely possible for a person skilled in the art. This is preferably based on a maximum bakeout temperature during the thermal treatment of the layer and the time from the beginning of heating at a first, preferably controlled temperature until the bakeout temperature is reached. A shorter time preferably means a higher positive rate of temperature change, because the temperature rises faster. Preferably the temperature increases linearly in time. However, a temporally non-linear rise can also be advantageous. Preferably, the dependence of oxidation on temperature also depends on the saturation of the ambient atmosphere with oxygen.

Exemplary reaction pathways of complexation and oxidation for CuSCN are shown below. The pyridines or pyridine-like solvents saturate preferably with oxygen in air and oxidize preferentially to pyridine-N-oxides (PyO):

$$2\text{pyridines} + \text{O}2 \Rightarrow 2\text{pyridine-N-oxides} \qquad (1)$$

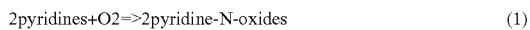

Therefore, the preferred complexation preferentially proceeds differently depending on, whether the complexation takes place under an oxygen-containing atmosphere (2a) or without oxygen (2b):

$$2\text{pyridine-N-oxides} + 2\text{Cu(I)SCN} \Rightarrow 2\text{Cu(II)[SCN]}[\text{PyO}] \qquad (2a)$$

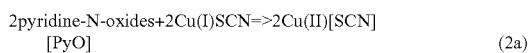

$$2\text{pyridines} + \text{Cu(I)SCN} \Rightarrow 2\text{Cu(I)[SCN][Py]} \qquad (2b)$$

[Py] describes preferably non-oxidized pyridines or pyridine-like solvents. Therefore, the thermal treatment process varies depending on the (preferably previous) presence of oxygen. In the presence of oxygen, there are two reactions (3a.I) and (3a.II), preferably occuring in parallel:

$$2\text{Cu(II)[SCN][PyO]} + \Delta T \Rightarrow \text{Cu(II)O} + \text{Cu(II)SCN}_2 + \text{Pyridines} \uparrow \qquad (3a.I)$$

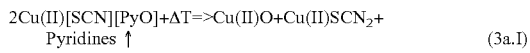

$$2\text{Cu(II)[SCN][PyO]} + \Delta T \Rightarrow \text{Cu}_2(\text{II})[\text{O}][\text{SCN}]_2 + \text{pyridines} \uparrow \qquad (3a.II)$$

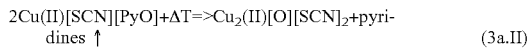

In this context, $\Delta T$ preferably refers to the thermal treatment and $\uparrow$ preferably refers to the extinction and/or evaporation of the pyridines or pyridine-like solvents. (3a.I) preferably describes the decomposition of the complex and the release of the pyridines or pyridine-like solvents. In (3a.II) a mixture is preferably formed which connects 2 copper thiocyanate molecules with each other through an oxygen atom. See preferably also NCS—Cu—O—Cu—SCN. If no oxygen was previously present, preferably no doping takes place:

$$2\text{Cu(I)[SCN][Py]} + \Delta T \Rightarrow 2\text{Cu(I)SCN} + 2\text{pyridines} \uparrow \qquad (3b)$$

The divalent copper thiocyanate from reaction (3a.I) is preferably unstable and decomposes itself again to the monovalent Cu(I)SCN and an SCN:

$$\text{Cu(II)SCN}_2 \Rightarrow \text{Cu(I)SCN} + \text{SCN} \qquad (4)$$

The SCN is herein preferably the p-dotant. The process of p-doping with SCN is known in the literature. A p-doping can preferably be caused by both SCN and CuO. It is particularly preferred that both variants (3a.I) and (3a.II) occur during the process.

In a further aspect, the invention relates to an electronic component (electronic device) with a cathode and an anode and a layer system between the cathode and the anode comprising several electroactive layers, wherein the layer system comprises at least one hole transport layer, producible by a method described above.

Preferably, the electronic component is an optoelectronic component, e.g. an OLED or an organic solar cell. It may also be preferred that the component is an electronic component, e.g. an OFET or an OPV.

By means of the method described above, such components can be built easily and quickly, especially by a printing process, with excellent and precisely influenceable electrical and/or optical properties. In particular, the hole transport layer plays a decisive role for these properties.

The average person skilled in the art recognizes that technical features, definitions and advantages of preferred embodiments of the inventive method also apply to the electronic component and its embodiments.

In a further aspect, the invention relates to an optoelectronic component (optoelectronic device) in which the layer system comprises
- preferably at least one electron injection layer or electron extraction layer,
- at least one electron transport layer and/or hole block layer
- at least one optically active layer
- at least one hole transport layer and/or electron block layer
- preferably at least one hole injection layer or hole extraction layer,
- wherein the hole transport layer and/or the electron block layer can be produced by a method according to the above description.

The average person skilled in the art recognizes that technical features, definitions and advantages of preferred embodiments of the method according to the invention also apply to the optoelectronic component according to the invention and its embodiments.

In a preferred optoelectronic component, e.g. an OLED, there are usually several layers of organic semiconducting materials between two electrodes. In particular, an OLED comprises one or more emitter layers (EL), in which electromagnetic radiation, preferably in the visible range, is generated by recombining electrons with electron holes. The electrons and electron holes are each provided by a cathode or anode, respectively. Preferably, so-called injection layers facilitate the process by lowering the injection barrier. OLEDs therefore usually have electron or hole injection layers. Furthermore, OLEDs usually have electron and hole transport layers (HTL or ETL), which support the diffusion direction of the electrons and holes to the emitter layer. In OLEDs, these layers are made of organic materials. In hybrid optoelectronic components, the layers can partly consist of organic and partly of inorganic semiconducting materials. For linguistic simplification, hybrid LEDs, which can include organic and inorganic semiconductor layers, are also called organic light-emitting diodes (OLEDs).

The advantageous properties of optoelectronic components comprising organic semiconducting materials for light generation (OLEDs) can also be transferred to the generation of electric current. Organic solar cells or hybrid solar cells, for example, are also characterized by a thin layer structure, which significantly increases the possible applications compared to classic inorganic solar cells. The structure of organic solar cells or hybrid solar cells show similarities to OLEDs or hybrid LEDs. For linguistic simplification, hybrid solar cells of organic-inorganic layers are also subsumed under the term organic solar cells.

Instead of an emitter layer, however, one or more absorber layers are present as photoactive layer. In the absorber layer, electron-hole pairs are generated due to incident electromagnetic radiation. In contrast to inorganic solar cells, the organic emitter layer usually first forms so-called excitons, which are present as bound electron-hole pairs. These are then separated into free charge carriers.

Hole block layers are intended to prevent the injection of holes from the adjacent layers. This is desired in e.g. OLEDs for the emission layer. In this case, it is preferred that the charge carriers, holes and electrons, cannot easily leave the layer and thus the recombination rate of both charge carriers in the layer is increased. A hole block layer would therefore preferably be deposited on the cathode side adjacent to the emission layer. The hole block layer is preferably characterized by a very low HOMO level, so that holes from the HOMO of the emission layer can essentially not be injected into the HOMO of the hole block layer or only with difficulty. The deeper the HOMO of the hole block layer compared to the HOMO of the emission layer, the better the blocking effect.

An electron block layer can be described in the same way, but the position of the LUMO or lowest unoccupied molecular orbital is the preferred choice.

Meanwhile, the properties of a hole block layer and an electron transport layer or a hole transport layer and/or electron block layer can preferably be fulfilled by a single material or layer.

It is preferable to manufacture the entire optoelectronic component by a wet chemical process, especially a printing process. At the same time, all layers, both individually and in combination, should exhibit particularly advantageous electrical properties. By producing the hole transport layer and/or electron block layer by the above-mentioned method, these goals can be achieved and the properties of the component can be further improved.

DETAILED DESCRIPTION

In the following, the invention will be explained in more detail by means of examples and FIGURES, without intending to be limiting.

BRIEF DESCRIPTION OF THE FIGURES

FIG. 1 shows a schematic representation of a CuSCN molecule.

DETAILED DESCRIPTION OF THE FIGURES

CuSCN is a pseudohalide and as a crystal structure forms a coordination network, see FIG. 1, left side. It belongs to the class of coordination polymers, i.e. inorganic polymers. The copper central atom coordinates on three sides with the sulfur atom of the thiocyanate group and on another side with the nitrogen atom of the thiocyanate group, see FIG. 1, right side.

It is noted that different alternatives to the described embodiments of the invention can be used to execute the invention and to arrive at the solution according to the invention. Thus, the component according to the invention as well as the system are not limited in their embodiments to the above described preferred embodiments. Rather, a plurality of embodiments is conceivable, which may deviate from the solution presented. The aim of the claims is to define the scope of protection of the invention. The scope of protection of the claims is aimed at covering the method and the component in accordance with the invention.

The invention claimed is:

1. A method for producing a printable ink comprising:
providing a transition metal-containing pseudohalide or chalcogenide as a solid;
providing a pyridine-like or thiol-like solvent;
mixing the pseudohalide or chalcogenide with the pyridine-like or thiol-like solvent to form pseudohalide or chalcogenide-containing complexes;
filtering the pseudohalide or chalcogenide complexes from the mixture from the previous step;
mixing the pseudohalide or chalcogenide-containing complexes with the pyridine-like or thiol-like solvent and/or with one or more other solvents to produce the printable ink.

2. The method according to claim 1
characterized in that
the pseudohalide is a metal thiocyanate or metal isothiocyanate.

3. The method according to claim 1
characterized in that
the pseudohalide is selected from the group consisting of metal cyanide, metal fulminate, metal cyanate, metal selenocyanate, metal tellurium cyanate and/or metal azide.

4. The method according to claim 1
characterized in that
the pseudohalide is a nonlinear metal anion.

5. The method according to claim 1
characterized in that
the chalcogenide is a sulfide.

6. The method according to claim 1
characterized in that
the transition metal-containing pseudohalide or chalcogenide is a metal thiocyanate or metal isothiocyanate, wherein in step c) a doping of the material takes place by a partial oxidation of the metal, and the degree of oxidation during complexation is controlled by the ratio of solid to pyridine-like or thiol-like solvent, where a higher ratio means increased oxidation.

7. The method according to claim 1 characterized in that
the pyridine-like solvent is a pyridine in which at least one position of the pyridine ring is substituted by a group selected from a group comprising an alkyl group, a carboxyl group, an acetyl group, a hydroxyl group and/or a thiol group and/or a halogen.

8. The method according to claim 7 characterized in that
the pyridine-like solvent is selected from a group consisting of methylpyridines, ethylpyridines, bromopyridines, tert-butylpyridines, and combinations thereof.

9. The method according to claim 1
characterized in that
the thiol-like solvent is selected from a group consisting of thioanisols, alkylthiophenes, allylthiophenes, and thioglycolic acids.

10. The method according to claim 1
characterized in that
the printable ink comprises
0.1-10% by weight of pseudohalide containing complexes and
5-99.9% by weight of the pyridine-like or thiol-like solvent
wherein the % by weight is based on the total weight of the ink and the sum of the % by weight is less than or equal to 100.

11. The method according to claim 1
characterized in that
the printable ink comprises
0.1-10% by weight of pseudohalide or chalcogenide-containing complexes
5-99.7% by weight of the pyridine-like or thiol-like solvent,
0.1-50% by weight of a second solvent which is liquid at standard conditions,
0.1-50% by weight of a third solvent which is liquid at standard conditions wherein the % by weight is based on the total weight of the ink and the sum of the % by weight is less than or equal to 100.

12. The method according to claim 11
characterized in that
the second solvent increases the printability of the ink, wherein the second solvent is a solvent with a lower surface tension at standard conditions than the pyridine-like or thiol-like solvent.

13. The method according to claim 11
characterized in that
the third solvent increases the drying time of the ink, wherein the third solvent is a solvent with a higher viscosity at standard conditions than the pyridine-like or thiol-like solvent.

14. A printable ink producible by a method according to claim 1.

15. The method according to claim 1
characterized in that
in a subsequent step f) a layer is produced by applying the printable ink by means of a printing method and/or a wet process.

16. The method according to claim 15
characterized in that
a thermal treatment of the layer produced in step f) is carried out at a temperature between 50° C. and 180° C.

17. The method according to claim 16
characterized in that
the transition metal-containing pseudohalide or chalcogenide is metal thiocyanate or metal isothiocyanate, and the thermal treatment within the layer results in doping of the material by partial oxidation of the metal.

18. The method according to claim 17
characterized in that
the degree of oxidation during thermal treatment is controlled by
the saturation of the ambient atmosphere with oxygen, whereby more oxygen means increased oxidation and/or
the rate of temperature change over time during thermal treatment, whereby a higher positive rate of change until the final bakeout temperature means increased oxidation.

19. An electronic component with a cathode and an anode and a layer system between the cathode and the anode comprising several electroactive layers
characterized in that
the layer system comprises at least a hole transport layer, producible by a method according to claim 15.

20. An optoelectronic component according to claim 19
characterized in that
the layer system comprises
at least one electron transport layer and/or hole block layer at least one optically active layer
at least one hole transport layer and/or electron block layer
wherein the hole transport layer and/or the electron block layer produced by a method according to claim 15.

* * * * *